(12) United States Patent
Lee (10) Patent No.: US 7,207,763 B2
(45) Date of Patent: Apr. 24, 2007

(54) SEMICONDUCTOR MANUFACTURING SYSTEM AND WAFER HOLDER FOR SEMICONDUCTOR MANUFACTURING SYSTEM

(75) Inventor: Byung-Il Lee, Daejeon (KR)

(73) Assignee: Terasemicon Co., Ltd, Hwawung, Gyeonggi-do (KR)

( * ) Notice: Subject to any disclaimer, the term of this patent is extended or adjusted under 35 U.S.C. 154(b) by 179 days.

(21) Appl. No.: 10/839,711

(22) Filed: May 6, 2004

(65) Prior Publication Data

US 2005/0158164 A1 Jul. 21, 2005

(30) Foreign Application Priority Data

Jan. 15, 2004 (KR) .................. 10-2004-0003072

(51) Int. Cl.
*H01L 21/673* (2006.01)

(52) U.S. Cl. .................. 414/217; 414/939; 156/345.3; 211/41.8

(58) Field of Classification Search ................ 414/217, 414/935, 939, 222.09; 156/345.3; 211/41.18
See application file for complete search history.

(56) References Cited

U.S. PATENT DOCUMENTS

| | | | | | |
|---|---|---|---|---|---|
| 5,219,079 | A | * | 6/1993 | Nakamura | ................ 211/41.18 |
| 5,275,521 | A | * | 1/1994 | Wada | ......................... 414/404 |
| 5,515,986 | A | * | 5/1996 | Turlot et al. | ................... 216/71 |
| 5,718,574 | A | * | 2/1998 | Shimazu | ..................... 432/253 |
| 5,752,609 | A | * | 5/1998 | Kato et al. | ................ 211/41.18 |
| 5,882,417 | A | * | 3/1999 | van de Ven et al. | ......... 118/728 |
| 5,925,411 | A | * | 7/1999 | van de Ven et al. | ..... 427/248.1 |
| 5,947,718 | A | * | 9/1999 | Weaver | ........................ 432/77 |
| 5,984,607 | A | * | 11/1999 | Oosawa et al. | ......... 414/222.06 |
| 6,296,735 | B1 | * | 10/2001 | Marxer et al. | ......... 156/345.32 |
| 6,321,680 | B2 | * | 11/2001 | Cook et al. | .............. 118/723 E |
| 6,435,798 | B1 | * | 8/2002 | Satoh | ......................... 414/217 |
| 6,485,248 | B1 | * | 11/2002 | Taylor, Jr. | ................... 414/672 |
| 6,517,303 | B1 | * | 2/2003 | White et al. | ................. 414/217 |
| 6,533,534 | B2 | * | 3/2003 | Schmitt et al. | ......... 156/345.31 |
| 6,780,251 | B2 | * | 8/2004 | Tometsuka | ................... 118/725 |
| 6,799,940 | B2 | * | 10/2004 | Joe et al. | ..................... 414/935 |
| 6,935,466 | B2 | * | 8/2005 | Lubomirsky et al. | ....... 187/250 |
| 2002/0187023 | A1 | * | 12/2002 | Araki | .......................... 414/160 |
| 2003/0049372 | A1 | * | 3/2003 | Cook et al. | .............. 427/248.1 |
| 2003/0168439 | A1 | * | 9/2003 | Kanno et al. | ................ 219/390 |
| 2004/0105742 | A1 | * | 6/2004 | Park et al. | ............. 414/416.01 |
| 2005/0126482 | A1 | * | 6/2005 | Jeong et al. | ................. 118/715 |

\* cited by examiner

*Primary Examiner*—Eileen D. Lillis
*Assistant Examiner*—Charles Greenhut
(74) *Attorney, Agent, or Firm*—Robert E. Bushnell, Esq.

(57) ABSTRACT

A semiconductor manufacturing system and wafer holder for a semiconductor manufacturing system which prevents a semiconductor wafer from being exposed to a process reaction and which includes a reaction tube for providing a sealed process space and a dual boat and which prevents the backside deposition by the wafer holder. The wafer holder includes a holder body to hide the backside of the semiconductor wafer during a process in the reaction tube and a wafer lifter having a portion that can be disengaged from and coupled to the holder body so that a lower portion of the semiconductor wafer is supported by the dual boat and so that the semiconductor wafer can be lifted up from the wafer body when the semiconductor wafer is loaded and unloaded. A separation boundary between the holder body and the wafer lifter includes a gas inflow interception surface to hinder reaction gas from flowing through the separation boundary.

12 Claims, 6 Drawing Sheets

SEMICONDUCTOR MANUFACTURING SYSTEM AND WAFER HOLDER FOR SEMICONDUCTOR MANUFACTURING SYSTEM

CLAIM OF PRIORITY AND CROSS-REFERENCE TO RELATED APPLICATIONS

This application makes reference to, incorporates the same herein, and claims all benefits accruing under 35 U.S.C. §119 from an application for WAFER-HOLDER FOR SEMICONDUCTOR MANUFACTURING PROCESS filed in the Korean earlier filed in the Korean Intellectual Property Office on 15 Jan. 2004 and there duly assigned Serial No. 2004-3072. Furthermore, the present application is related to a co-pending U.S. applications, Ser. No. 10/839,710, entitled FORMING THIN FILM ON SEMICONDUCTOR WAFER, based upon Korean Patent Application Serial No. 2003-00091246 filed in the Korean Intellectual Property Office on 15 Dec. 2003, filed in the U.S. Patent & Trademark Office concurrently with the present application on 6 May 2004, and was published on 16 Jun. 2005 as U.S. 2005/0126482. Furthermore, this application is related to a co-pending U.S. application Ser. No. 10/334,797 filed on the 2 Jan. 2003, and published as U.S. 2004/0105742 to Park et al., on 3 Jun. 2004.

BACKGROUND OF THE INVENTION

1. Field of the Invention

The present invention relates to a semiconductor manufacturing system and a wafer holder for a semiconductor manufacturing system, and more particularly, to a semiconductor manufacturing system and a wafer holder for a semiconductor manufacturing system which improves yield and productivity by preventing a semiconductor wafer from being exposed to a process reaction in a semiconductor manufacturing system that uses a dual boat and prevents the backside deposition by the wafer holder.

2. Description of the Related Art

Generally, a semiconductor manufacturing system for processing a semiconductor wafer is classified into a batch wafer type system and a single wafer type system. In the batch wafer type system, a wafer loading boat is included for loading a plurality of semiconductor wafers therein so as to improve processing capability. In the single wafer type system, a process time required to process the semiconductor wafer sheet by sheet is shortened.

However, since the conventional batch semiconductor manufacturing system has a slot occupying an edge portion of the semiconductor wafer during processing, a film formed by the semiconductor process is formed on both sides of semiconductor wafer, a loading boat for supporting a lower portion of the semiconductor wafer, and in slots.

Accordingly, when the wafer is unloaded after a film formation process for manufacturing semiconductor has been completed, a film integrated with a wafer and a slot is destroyed. When the film is destroyed, particles are generated. Especially, a comparatively large number of particles are generated at a backside of the wafer.

In addition, since various films are laminated on the backside, mechanical stress is repeatedly applied to the semiconductor wafer and the semiconductor wafer gets bent. Since the film uniformity of the backside of the semiconductor wafer is greatly reduced in comparison with the film uniformity of the upper surface of the semiconductor wafer, many processing problems are caused in the proceeding processes, especially photolithography.

Therefore, the inventors have suggested a semiconductor manufacturing system that fundamentally prevents a film from being formed on the backside of a semiconductor wafer during a film formation process for manufacturing semiconductor so that the production yield is improved and the productivity of the overall semiconductor manufacturing process is greatly improved (Korean Patent Application Number: 10-2003-0091246).

SUMMARY OF THE INVENTION

Accordingly, the present invention is directed to a semiconductor manufacturing system and a wafer holder for a semiconductor manufacturing system that substantially obviates one or more problems due to limitations and disadvantages of the related art.

An object of the present invention is to provide a semiconductor manufacturing system and wafer holder for a semiconductor manufacturing system which improves yield and productivity of semiconductor by fundamentally preventing a semiconductor wafer from being exposed to a process reaction in the semiconductor manufacturing system that uses a dual boat and prevents a film from being deposited on the backside of the wafer by using the wafer holder.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a wafer holder is provided for a semiconductor manufacturing system that comprises a reaction tube and a dual boat, the reaction tube providing a semiconductor wafer with a sealed space to perform a process, the dual boat being arranged in the process space provided by the reaction tube and loading at least one semiconductor wafer, the dual boat including first and second wafer loading boats, the first and second wafer loading boats spaced from each other and moving up and down with respect to each other, the wafer holder being mounted on the dual boat, the semiconductor wafer being arranged on the wafer holder, a backside of the semiconductor wafer being hidden during a process, the wafer holder comprising: a holder body adapted to hide the backside of the semiconductor wafer during a process in the reaction tube and including a wafer lifter having a portion that can be disengaged from and coupled to the holder body so that a lower portion of the semiconductor wafer is supported by the dual boat and so that the semiconductor wafer can be lifted up from the wafer body when the semiconductor wafer is loaded or unloaded; and a separation boundary arranged between the holder body and the wafer lifter and including a gas inflow interception surface adapted to hinder reaction gas from flowing through the separation boundary.

Preferably, the gas inflow interception surface comprises tapered surfaces facing each other.

Preferably, the gas inflow interception surface comprises bent and stepped surfaces that are continually bent.

Preferably, the wafer lifter comprises support poles adapted to support at least three points of the semiconductor wafer in a side guard of the holder body; wherein the holder body includes through holes adapted to inset the support poles into and remove the support poles therefrom; and wherein at least one of the support poles has a lifting rod arranged a lower portion thereof, the lifting rod being adapted to be operated by a second wafer loading boat of the dual boat.

Preferably, the lifting rod has an insertion groove arranged at a lower portion thereof such that an end portion of the wafer support of the second wafer loading boat is adapted to be inserted into and coupled to the insertion groove.

Preferably, the wafer lifter comprises support poles adapted to support at least three points of the semiconductor wafer in a side guard of the holder body; wherein the holder body includes through holes adapted to inset the support poles into and remove the support poles therefrom; and wherein at least one of the support poles has a lifting rod arranged a lower portion thereof, the lifting rod being adapted to be operated by a robot arm, the robot arm including a lifting rod adapted to lift up the support pole.

Preferably, wafer lifter comprises: an upper holder body portion operated by the second wafer loading boat and adapted to lift up at least the semiconductor wafer; and a lower holder body portion arranged on the first wafer loading boat; wherein the upper holder body portion has a cutaway portion adapted to provide an insertion area to a robot arm for loading and unloading the semiconductor wafer; and wherein the lower holder body includes a projecting latch engaged with the cutaway portion and an opener formed at an edge thereof, the opener adapted to allow the second wafer loading boat to lift up the upper holder body.

Preferably, the wafer lifter comprises a wafer lifting support adapted to be coupled to the second wafer loading boat of the dual boat, the wafer lifting support extending to inside of the wafer side guard such that at least an edge of the semiconductor wafer is placed on the wafer lifting support and wherein the first wafer loading boat is arranged adjacent to the opener provided by separation of the wafer lifting support to allow the holder body to be placed thereon.

Preferably, a wafer lifter body is adapted to be coupled to the second wafer loading boat and wherein a coupling hole is arranged on one of a lower portion of the wafer lifter body and the support of the second wafer loading boat and wherein a coupling pin, adapted to be inserted into the coupling hole, is arranged on the other one of the lower portion of the wafer lifter body and the support of the second wafer loading boat.

To also achieve these objects and other advantages and in accordance with the purpose of the invention, as embodied and broadly described herein, a semiconductor manufacturing system is provided comprising: a reaction tube and a dual boat, the reaction tube providing a semiconductor wafer with a sealed space to perform a process, the dual boat being arranged in the process space provided by the reaction tube and loading at least one semiconductor wafer, the dual boat including first and second wafer loading boats, the first and second wafer loading boats spaced from each other and moving up and down with respect to each other; a wafer holder mounted on the dual boat, the semiconductor wafer being arranged on the wafer holder, a backside of the semiconductor wafer being hidden during a process, the wafer holder comprising: a holder body adapted to hide the backside of the semiconductor wafer during a process in the reaction tube and including a wafer lifter having a portion that can be disengaged from and coupled to the holder body so that a lower portion of the semiconductor wafer is supported by the dual boat and so that the semiconductor wafer can be lifted up from the wafer body when the semiconductor wafer is loaded or unloaded; and a separation boundary arranged between the holder body and the wafer lifter and including a gas inflow interception surface adapted to hinder reaction gas from flowing through the separation boundary.

It is to be understood that both the foregoing general description and the following detailed description of the present invention are exemplary and explanatory and are intended to provide further explanation of the invention as claimed.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIGS. 2B1 and 2B2 are cross-sectional views taken along a line A—A in FIG. 2A;

FIGS. 3B1 and 3B2 are cross-sectional views taken along a line B—B in FIG. 3A;

FIGS. 4B1 and 4B2 are cross-sectional views taken along a line C—C in FIG. 4A.

DETAILED DESCRIPTION OF THE INVENTION

Figure 1A:
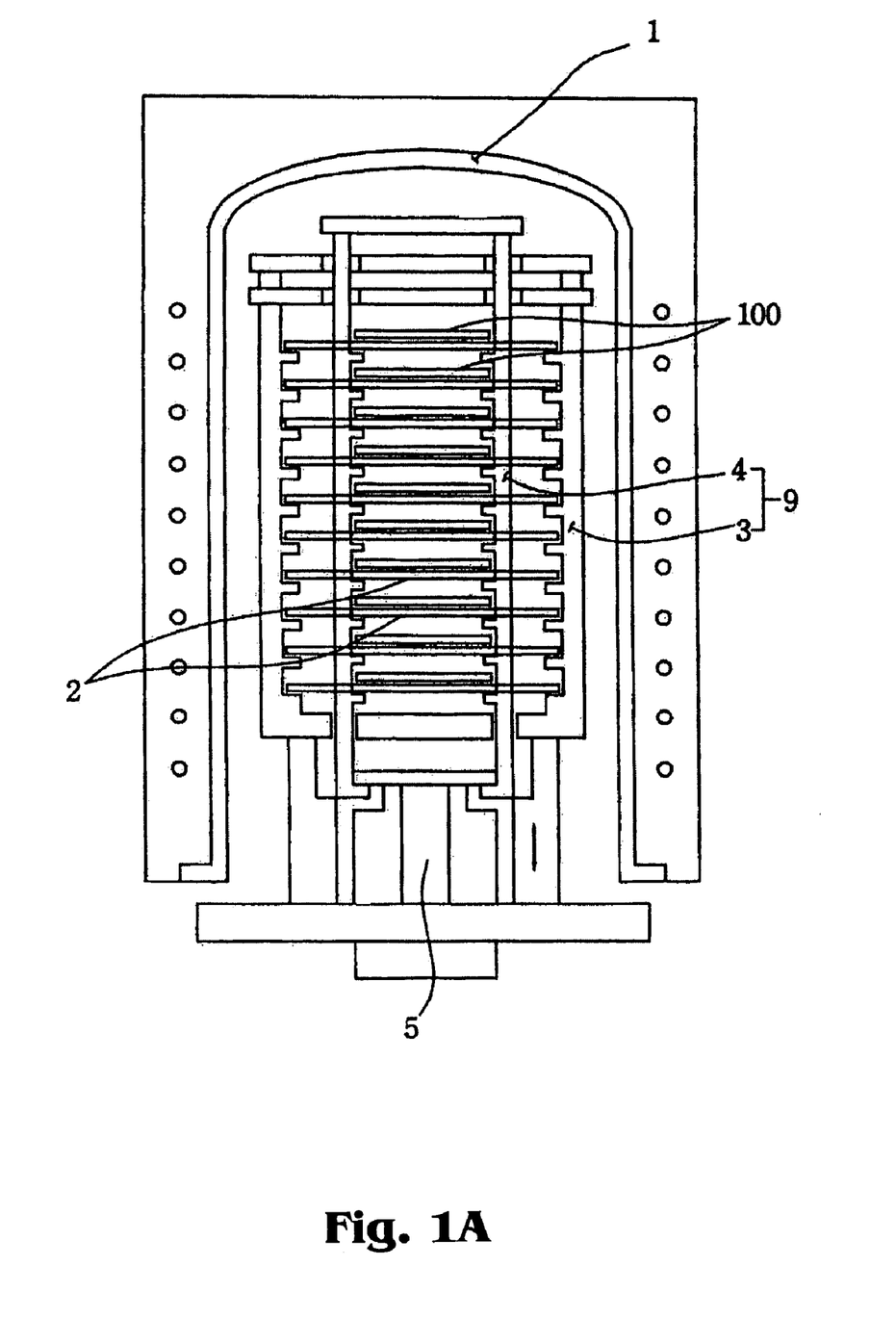
FIG. 1A is a sectional view of a semiconductor manufacturing system provided with a dual boat and a wafer holder to prevent backside deposition.

As shown in FIG. 1A, a single wafer type semiconductor manufacturing system includes a reaction tube 1, a dual wafer loading boat 9, a gap adjusting unit 5 (driving unit), and a gas supply unit. The reaction tube 1 has a sealed process space to perform a film formation process on a semiconductor wafer 100. The dual wafer loading boat 9 consists of a first wafer loading boat 3 and a second wafer loading boat 4. The first wafer loading boat 3 supports a wafer holder 2 that is arranged in the process space of the reaction tube 1 and that can load and support at least one semiconductor wafer 100 to prevent a film from being deposited on the backside of the semiconductor wafer 100. The second wafer loading boat 4 includes a second wafer support that is arranged adjacent to an inner side or an outer side of the first wafer loading boat 3, is configured to finely move up and down with respect to the first wafer loading boat 3, and supports an edge portion of the wafer holder 2. The gap adjusting unit 5 is arranged under a lower portion of the dual wafer loading boat 9, independently respectively supports lower portions of the first wafer loading boat 3 and the second wafer loading boat 4, and can move one of the first wafer loading boat 3 and the second wafer loading boat 4 up and down to relatively control a support state of the semiconductor wafer. The gas supply unit supplies the reaction tube with at least one process gas.

Figure 1B:
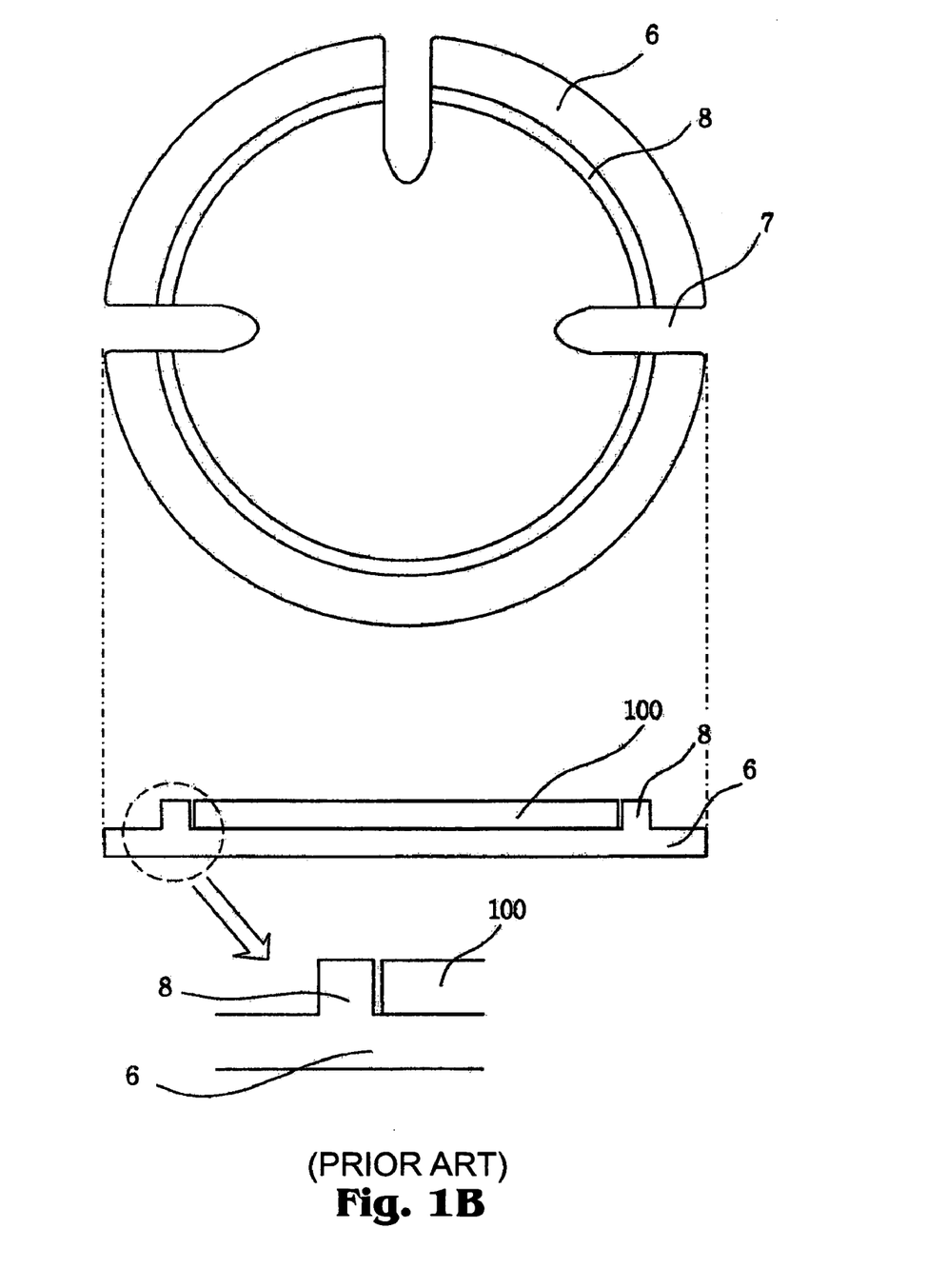
FIG. 1B is a view of a wafer holder adapted to a semiconductor manufacturing system.

As shown in FIG. 1B, an earlier conventional wafer holder 2 includes a holder body 6, an opener 7, and a wafer side guard 8. The holder body 6 is substantially flat and circular. The opener 7 is formed by forming the portion overlapped with the wafer support 7 into a predetermined figure. The wafer side guard 8 is formed on a plate surface of the wafer holder 6 and is adhered to side edge of the semiconductor wafer 100 so that the process gas cannot penetrate through the side edge of the semiconductor wafer 100. The wafer side guard 8 is a ring that projects upwardly from the plate surface at the edge of the semiconductor wafer 100 as much as the thickness of the semiconductor wafer 100.

Since the semiconductor manufacturing system that has the wafer holder 2 and the dual boat 9 to which the wafer holder 2 is applied does not form a semiconductor film on the backside of the semiconductor wafer 100, faulty subsequent processes due to the semiconductor film being deposited on the backside of the semiconductor wafer can be prevented.

However, the semiconductor wafer 100 can be very slightly exposed through the wafer holder 2. This is due to the opener 7 that is a punched portion formed to move the wafer support of the second wafer loading boat 4 up and down.

In other words, after the process has been completed, in order to load/unload the semiconductor wafer 100 on/from the dual boat 9, the semiconductor wafer 100 must be spaced from the wafer holder 2 and must be spaced from the wafer holder 2 even during the process so that the second wafer loading boat is assembled to avoid interference with the wafer holder 2 and the opener 7.

The opener 7 exposes a small area of the semiconductor wafer 100 to the process and a process film can be formed on the small area during the process.

Reference will now be made in detail to exemplary embodiments of the present invention, examples of which are illustrated in the accompanying drawings.

Most of all, the wafer holder of the present invention is not limited to a ring type wafer holder shown in the drawings.

Specifically, a wafer side guard is of ring type merely as an example for illustrating the present invention. The present invention relates to a wafer holder body. It is to be understood that the present invention can also be applied to a taper type or pocket type wafer holder having a different side guard.

Figure 2A:
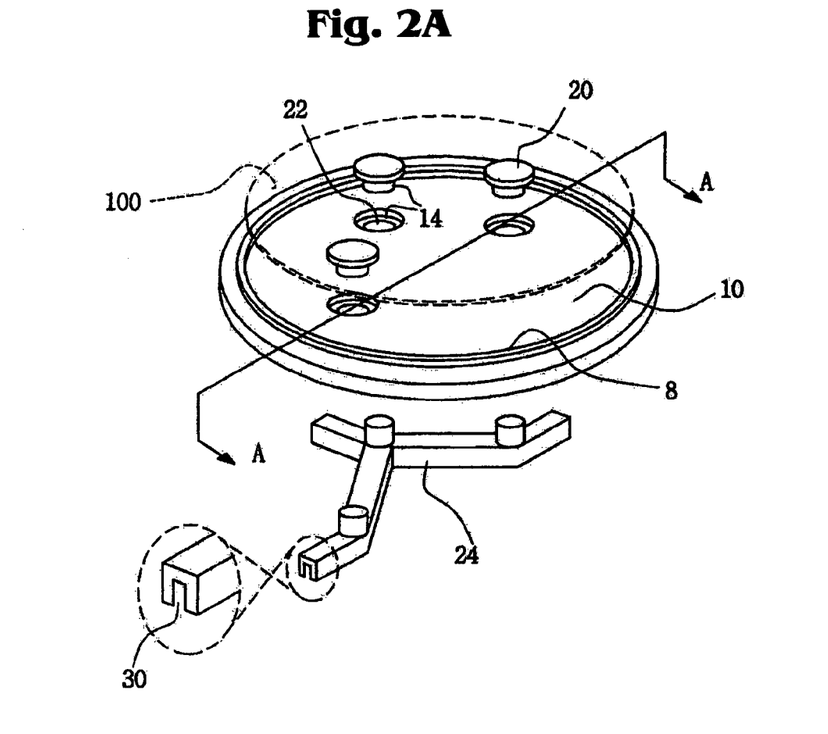
FIG. 2A is a perspective view of a first embodiment of a wafer holder of the semiconductor manufacturing system according to the present invention.
Figure 2B:
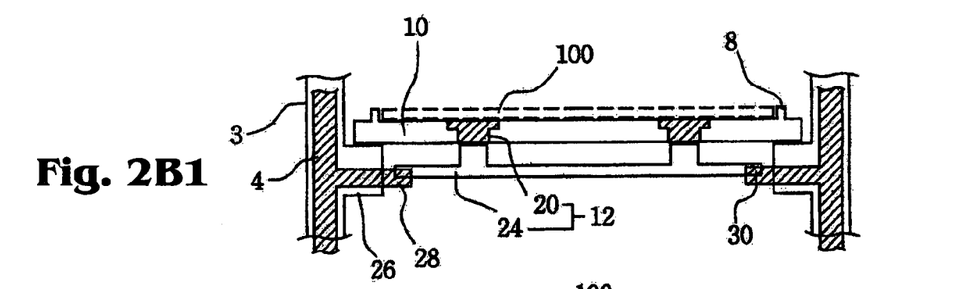
Figure 2B:
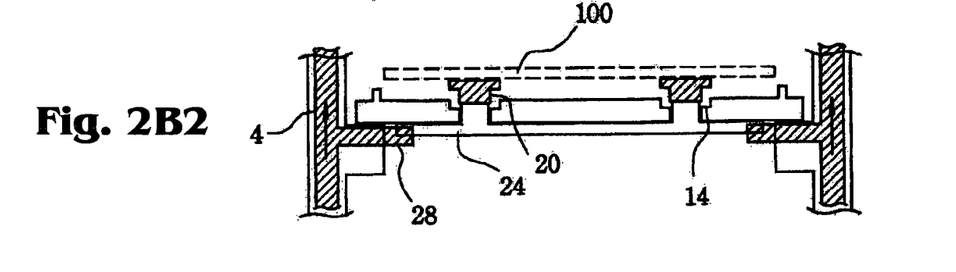
Figure 3A:
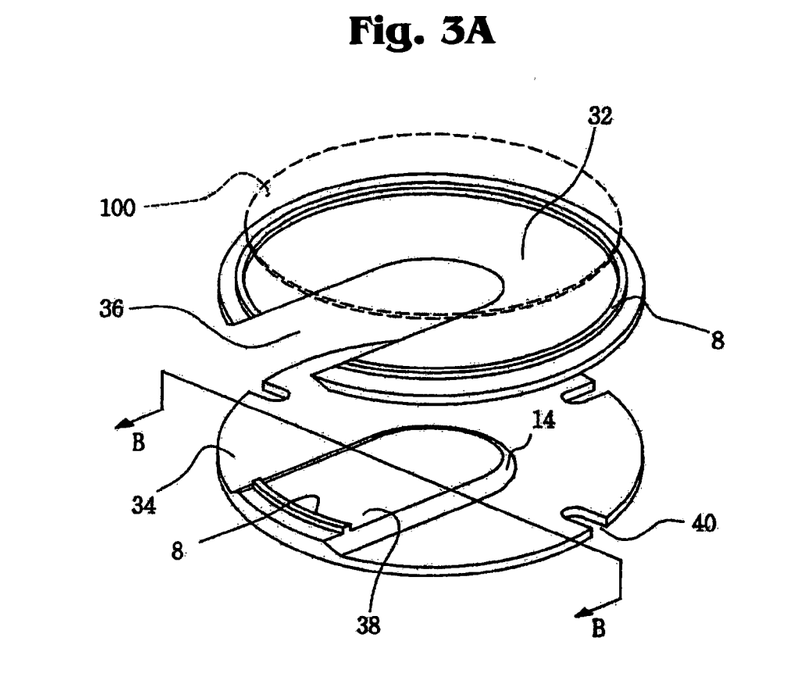
FIG. 3A is a perspective view of a second embodiment of a wafer holder of the semiconductor manufacturing system according to the present invention.
Figure 3B:
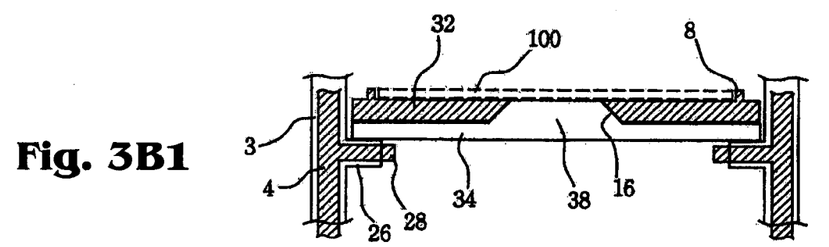
Figure 3B:
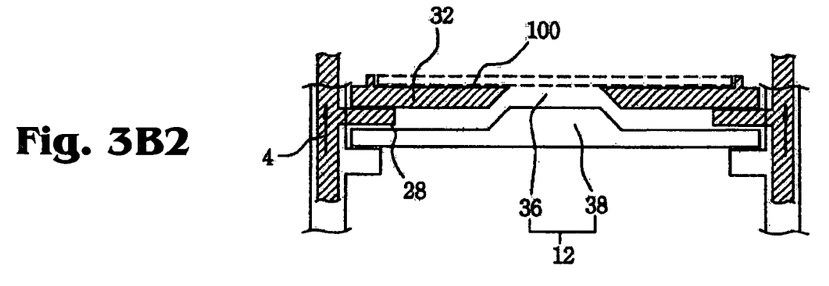
Figure 3C:
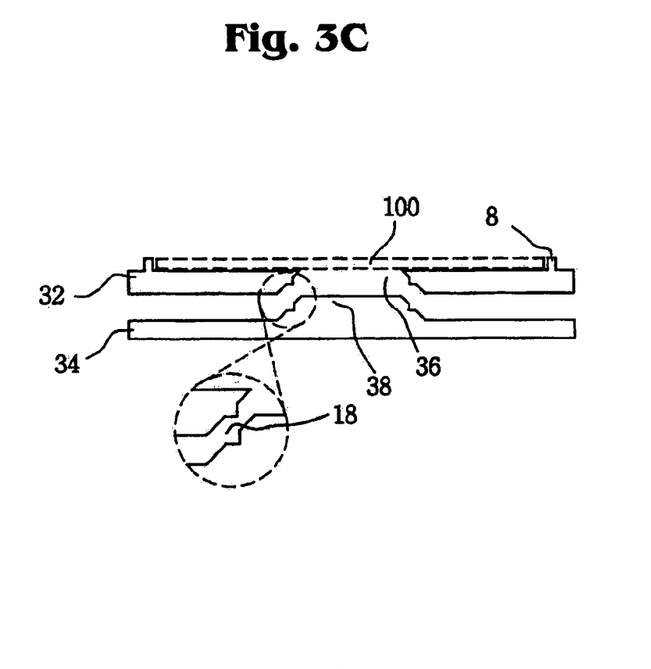
FIG. 3C is a cross-sectional view of another example of a gas inflow interception surface of the second embodiment.

FIG. 2A is a perspective view of a first embodiment of a wafer holder of the semiconductor manufacturing system according to the present invention. FIGS. 2B1 and 2B2 are cross-sectional views taken along a line A—A in FIG. 2A. FIG. 3A is a perspective view of a second embodiment of a wafer holder of the semiconductor manufacturing system according to the present invention. FIGS. 3B1 and 3B2 are cross-sectional views taken along a line B—B in FIG. 3A. FIG. 3C is a cross-sectional view of another example of a gas inflow interception surface of the second embodiment.

Figure 4A:
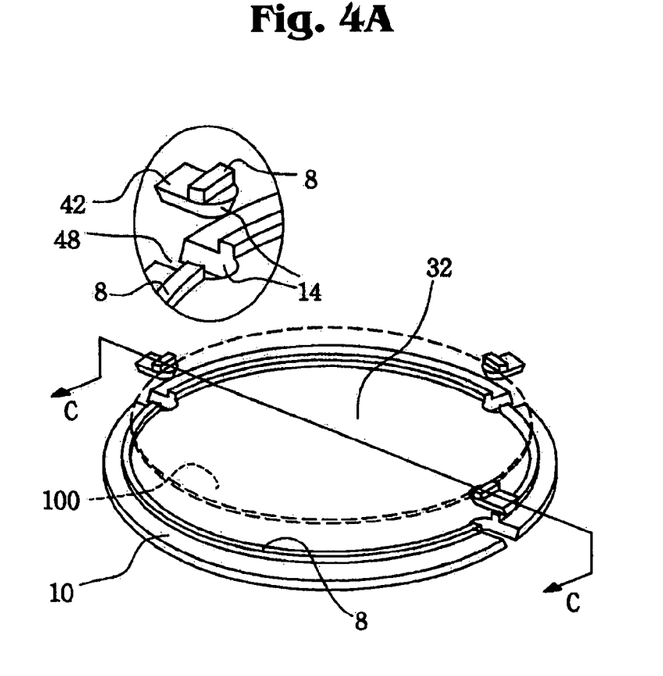
FIG. 4A is a perspective view of a third embodiment of a wafer holder of the semiconductor manufacturing system according to the present invention.
Figure 4B:
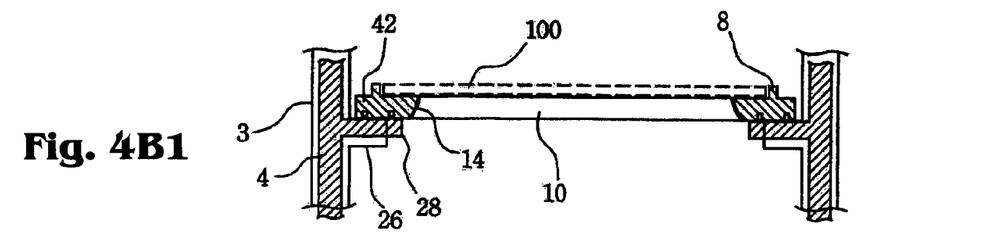
Figure 4B:
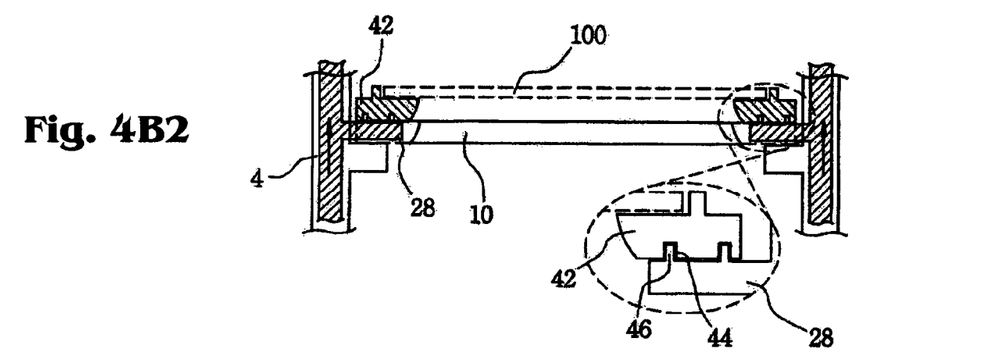
Figure 4C:
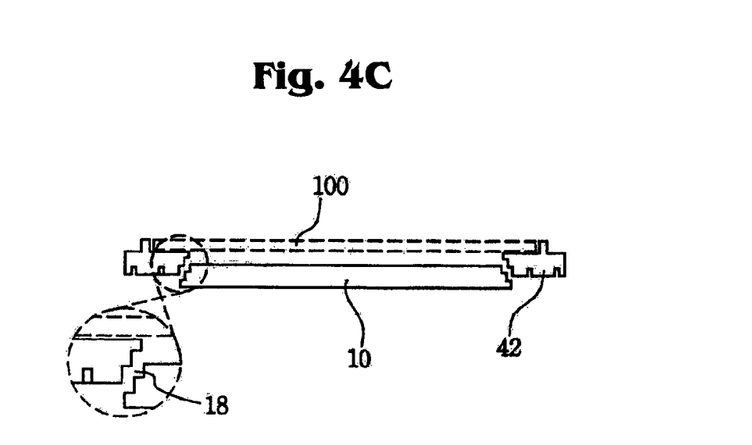
FIG. 4C is a cross-sectional view of another example of a gas inflow interception surface of the third embodiment.

FIG. 4A is a perspective view of a third embodiment of a wafer holder of the semiconductor manufacturing system according to the present invention. FIGS. 4B1 and 4B2 are cross-sectional views taken along a line C—C in FIG. 4A. FIG. 4C is a cross-sectional view of another example of a gas inflow interception surface of the third embodiment. The wafer holder of the present invention includes a reaction tube and a dual boat 9. The reaction tube provides a semiconductor wafer with a sealed space to perform a process. The dual boat 9 is arranged in the process space provided by the reaction tube and loads at least one semiconductor wafer 100. The dual boat 9 consists of a first wafer loading boat 3 and a second wafer loading boat 4. The first wafer loading boat 3 and the second wafer loading boat 4 move up and down with respect to each other and are spaced from each other. The wafer holder is mounted on the dual boat 9. The semiconductor wafer 100 is mounted on the wafer holder. A backside of the semiconductor wafer 100 is hidden during a process. The wafer holder is provided with a holder body 10 to hide the backside of the semiconductor wafer 100 during a process in the reaction tube for providing a sealed process space. The holder body 10 is provided with a wafer lifter 12 a portion of which can be disengaged from and coupled to the holder body 10 so that a lower portion of the semiconductor wafer 100 is supported through the dual boat 9 and so that the semiconductor wafer 100 can be lifted up from the wafer body 10 when the semiconductor wafer 100 is loaded/unloaded. A separation boundary between the holder body 10 and the wafer lifter 12 is provided with a gas inflow interception surface to hinder reaction gas from flowing in through the separation boundary so that the wafer lifter 12 can be engaged with and disengaged from the holder body 10.

In each embodiment of the present invention, the gas inflow interception surface 14 is formed of tapered surfaces 16 so that the holder body 10 and the wafer lifter 12 face each other to hinder the reaction gas from flowing in through the boundary between the holder body 10 and the wafer lifter 12 during the process in which the holder body 10 and the wafer lifter 12 are coupled to each other.

The gas inflow interception surface 14 is formed of bent and stepped surfaces 18 that are continually bent so that the holder body 10 and the wafer lifter 12 are engaged with and disengaged from each other to hinder the reaction gas from flowing in through the boundary during the process in which the holder body 10 and the wafer lifter 12 are coupled to each other.

The present invention is classified into several embodiments according to the wafer lifer 12. FIG. 2A is a perspective view of a first embodiment of a wafer holder of the semiconductor manufacturing system according to the present invention. FIGS. 2B1 and 2B2 are cross-sectional views taken along a line A—A in FIG. 2A.

In the first embodiment, the wafer lifer 12 of the wafer holder includes support poles 20 for supporting at least three points of the semiconductor wafer 100 in a side guard 8 of the holder body 10. The holder body 10 is provided with through holes 22 which the support poles 20 can be inserted into and removed from. The support pole 20 has a lower portion at which a lifting rod 24 operated by a second wafer loading boat 4 is arranged.

The wafer lifter is a cap type wafer lifter. The support pole 20 that is disengaged has a cap that is lifted from the wafer holder body 10 to support the semiconductor wafer.

Here, in the cap type case, a tapered surface or a bent and stepped surface is formed on the support poles 20 and the through holes 22 as the gas inflow interception surface 14. Their cross-sectional shape is deformed.

Since such a cap type wafer lifter is prepared in a wafer side guard 8 of the holder body 10, the backside of the semiconductor wafer 100 is prevented from being exposed to the process during the process in which the cap type wafer lifter operates with the wafer side guard 8.

In other words, when the semiconductor wafer 100 is mounted on the holder body 10 to perform the process, the side of the semiconductor wafer 100 is hidden by the wafer side guard 8 and the lower portion of the semiconductor wafer 100 is hidden by the holder body 10. At the same time, the gas inflow interception surface 14 prevents the gas from flowing in through the coupling boundary surface between the support poles 20 and the holder body 10.

The holder body 10 is placed on a wafer support 26 of the first wafer loading boat 3. The lifting rod 24 is arranged at a lower portion of the support pole 20. The lifting rod 24 is coupled with a wafer support 28 of the second wafer loading boat 4.

The lifting rod 24 can be circular, and has an insertion groove 30 formed at a lower portion thereof. An end portion of the wafer support 28 of the second wafer loading boat 4 is inserted into and coupled with the insertion groove 30.

According to the first embodiment, since only an upper surface of the semiconductor wafer 100 is exposed during a process, the deposition on the backside of the semiconductor wafer 100 is prevented.

Next, in order to operate a robot arm when the semiconductor wafer 100 is loaded/unloaded, the semiconductor wafer 100 must be spaced from the holder body 10. As the second wafer loading boat 4 is moved up, the wafer support 28 moves the lifting rod 24 up so that the support poles 20 moves the semiconductor wafer 100 up.

In the present invention, a designer feels free to design a slit or a wafer support of a first wafer loading boat and a second wafer loading boat when designing a dual boat.

It is because the wafer support of the second wafer loading boat does not contact the semiconductor wafer directly and a conventional opener with a small contact area is not required.

Consequently, in the present invention, the wafer support of the first wafer loading boat and the second wafer loading boat can be modified to some extent. The detailed description will be omitted due to the freedom of design.

In the first embodiment, the second wafer loading boat can be replaced by a robot arm because of placement distance.

The reason is as follows. In the first embodiment, in order to push the support pole, a lifting rod is required to be arranged at the lower portion of the support pole, which has a predetermined length necessary to provide a space in which a robot arm is operated when the semiconductor wafer is unloaded. Considering a thickness of the lifting rod, a predetermined spacing length of the lower portion of the wafer holder, a necessary space for movement of the reaction gas and a necessary space for the robot arm for the time when the semiconductor wafer is loaded/unloaded, the placement distance between the semiconductor wafers can get larger in a batch semiconductor manufacturing system.

Accordingly, in the wafer lifter of the first embodiment of the present invention, the second wafer loading boat is replaced with an additional robot arm (not shown), the robot arm includes a lifting rod to lift the support pole up.

Then, FIG. 3A is a perspective view of a second embodiment of a wafer holder of the semiconductor manufacturing system according to the present invention. FIGS. 3B1 and 3B2 are cross-sectional views taken along a line B—B in FIG. 3A. FIG. 3C is a cross-sectional view of another example of a gas inflow interception surface of the second embodiment. In the wafer lifter 12 of the wafer holder of the second embodiment, the holder body 10 has a function of the wafer lifter, and is divided into an upper holder body 32 and a lower holder body 34. The upper holder body 32 is operated by the second wafer loading boat 4 and lifts up at least the semiconductor wafer 100. The upper holder body 32 has a cutaway portion 36 that provides an insertion area to a robot arm for loading/unloading the semiconductor wafer 100. The lower holder body 34 is arranged on the first wafer loading boat 3. The lower holder body 34 includes a projecting latch 38 and an opener 40 at edge thereof. The projecting latch 38 is engaged with the cutaway portion 36. The opener 40 allows the wafer support 28 of the second wafer loading boat 4 to lift up the upper holder body 32.

In contrast to the first embodiment, the lifting rod of the first embodiment is replaced with the lower holder body 34. Since the lower holder body 34 and the upper holder body 32 are close to each other during the process, the placement distance between wafer holders is more reduced.

To achieve this, the upper holder body 32 has a cutaway portion 36 that provides a space for receiving and lifting up a semiconductor wafer 100 and an operation space to a robot arm for loading/unloading the semiconductor wafer 100. The lower holder body 34 includes a projecting latch 38 that forms a wafer holder shape by extending the cutaway portion 36.

The lower holder body 34 has the opener 40 formed at the outer side of the wafer side guard 8. The lower holder body 34 is placed on the wafer support 26 of the first wafer loading boat 3, and the upper holder body 32 is placed on the wafer support 26 of the second wafer loading boat 4 through the opener 40.

Accordingly, only the upper surface of the semiconductor wafer 100 is exposed to a process by the upper holder body 32 and the projecting latch of lower holder body coupled with the cutaway portion of the upper holder during the process.

Then, when the semiconductor wafer 100 is loaded/unloaded, the second wafer loading boat 4 is lifted, and its wafer support 28 is lifted through the opener 40 so that the upper holder body 32 is lifted and the cutaway portion 36 is exposed.

The robot arm loads/unloads the semiconductor wafer 100 through the cutaway portion 36.

FIG. 3C is a cross-sectional view of another example of a gas inflow interception surface of the second embodiment. As described above, the gas inflow interception surface 14 is formed to prevent the reaction gas from flowing in through the boundary gap between two separated members. The gas inflow interception surface 14 can be formed as a tapered surface 16 or as a bent and stepped surface 18 as shown in FIG. 3B. The gas inflow interception surface 14 can be formed of a combination of the above-mentioned surfaces 16 and 18.

FIG. 4A is a perspective view of a third embodiment of a wafer holder of the semiconductor manufacturing system according to the present invention. FIGS. 4B1 and 4B2 are cross-sectional views taken along a line C—C in FIG. 4A. FIG. 4C is a cross-sectional view of another example of a gas inflow interception surface of the third embodiment. In the third embodiment, the holder body 10 has a wafer lifting support 42 that has a function of the wafer lifter 12, is a portion separated from the holder body 10, and is coupled to the dual boat 9, especially the wafer support 28 of the second wafer loading boat 4. The wafer lifting support 42 is separated from the holder body 10 and formed to extend to inside of the wafer side guard 8 such that at least an edge of the semiconductor wafer 100 is placed on the wafer lifting support 42. Meanwhile, the first wafer loading boat 3 is adjacent to the side of the wafer lifting support 42 to allow the holder body to be placed thereon.

The wafer lifting support 42 is coupled to the second wafer loading boat. A coupling hole 44 is formed in one of a lower portion of the wafer lifting support 42 and the support 28 of the second wafer loading boat 4. A coupling pin 46 to be inserted is formed on the other one of the lower portion of the wafer lifting support 42 and the support 28 of the second wafer loading boat 4.

In contrast to the second embodiment, the lower wafer holder body separated from the holder body 10 of the second embodiment is replaced by the wafer lifting support 42 divided horizontally. Since the holder body 10 and the wafer lifting support 42 are horizontally arranged, the thickness is the same as that of one wafer holder so that the placement distance between the wafer holders is reduced.

The wafer lifting support 42 for this purpose can be engaged with and disengaged from the opener 48 of the holder body 10. A portion of the wafer lifting support 42 extends to the inside of the wafer side guard 8 and is in contact with a lower portion of an outer circumference of the semiconductor wafer.

The wafer lifting support 42 is coupled to the wafer support 28 of the second loading boat 4. The wafer support 26 of the first loading boat 3 is adjacent to the opener 48 provided by the wafer lifting support 42 such that the lower portion of the holder body 10 is placed on the wafer support 26.

Accordingly, The wafer lifting support 42 is coupled to the holder body 10 so that only the upper surface of the semiconductor wafer 100 is exposed during a process.

When the semiconductor wafer 100 is loaded/unloaded, the wafer support 28 of the second wafer loading boat 4 is moved up. Then, the wafer lifting support 42 coupled to the wafer support 28 is also moved up. Then, the semiconductor wafer 100 is also moved up, and the robot arm works.

The wafer lifting support 42 and the holder body 10 have a tapered gas inflow interception surface 14 which is small at its upper portion and large at its lower portion. FIG. 4C is a cross-sectional view of another example of a gas inflow interception surface of the third embodiment. In FIG. 4C, the bent and stepped surface 18 is depicted as described above.

According to each embodiment of the present invention, in a batch semiconductor manufacturing system, though a lot of semiconductor wafers are loaded, only the upper surface of the semiconductor wafer is exposed to a process so that a film is prevented from being formed on the backside of the semiconductor wafer.

Each of the embodiments has its specific advantage. For example, comparing the first embodiment with the third embodiment, the first embodiment is characterized in that a support pole is arranged inside a wafer side guard and the semiconductor is fundamentally prevented from being exposed but the placement distance between semiconductor wafers is increased due to the lifting rod. The third embodiment can be applied with minimal change of the conventional line though the conventional placement distance between semiconductor wafers is maintained enough, but a cut-line is generated on the wafer side guard due to additional wafer lifting support so that it is necessary to finely adjust the gap of the cut-line.

According to the present invention described above, the gas inflow interception surface is included and a portion of the wafer holder is separated from the wafer holder to form a wafer lifter so that the process exposure of the semiconductor wafer caused by the conventional opener is avoided and the yield and the productivity of the semiconductor is improved.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A wafer holder for a semiconductor manufacturing system that comprises a reaction tube and a dual boat, the reaction tube providing a semiconductor wafer with a sealed space to perform a process, the dual boat being arranged in the process space provided by the reaction tube and loading at least one semiconductor wafer, the dual boat including first and second wafer loading boats, the first and second wafer loading boats spaced from each other and moving up and down with respect to each other, the wafer holder being mounted on the dual boat, the semiconductor wafer being arranged on the wafer holder, a backside of the semiconductor wafer being hidden during a process, the wafer holder comprising:

a holder body adapted to hide the backside of the semiconductor wafer during a process in the reaction tube and including a wafer lifter having a portion that can be disengaged from and coupled to the holder body so that a lower portion of the semiconductor wafer is supported by the dual boat and so that the semiconductor wafer can be lifted up from the holder body when the semiconductor wafer is loaded or unloaded; and a separation boundary arranged between the holder body and the wafer lifter and including a gas inflow interception surface adapted to hinder reaction gas from flowing through the separation boundary;

wherein the wafer lifter includes support poles adapted to support at least three points of the semiconductor wafer in a side guard of the holder body;

wherein the holder body includes through holes adapted to inset the support poles into and remove the support poles therefrom;

wherein at least one of the support poles has a lifting rod arranged at a lower portion thereof, the lifting rod being adapted to be operated by the second wafer loading boat of the dual boat; and wherein the lifting rod has an insertion groove arranged at a lower portion thereof such that an end portion of the wafer support of a second wafer loading boat is adapted to be inserted into and coupled to the insertion groove.

2. The wafer holder of claim 1, wherein the gas inflow interception surface comprises tapered surfaces facing each other.

3. The wafer holder of claim 1, wherein the gas inflow interception surface comprises bent and stepped surfaces that are continually bent.

4. A semiconductor manufacturing system comprising:

a reaction tube and a dual boat, the reaction tube providing a semiconductor wafer with a sealed space to perform a process, the dual boat being arranged in the process space provided by the reaction tube and loading at least one semiconductor wafer, the dual boat including first and second wafer loading boats, the first and second wafer loading boats spaced from each other and moving up and down with respect to each other;

a wafer holder mounted on the dual boat, the semiconductor wafer being arranged on the wafer holder, a backside of the semiconductor wafer being hidden during a process, the wafer holder comprising:

a holder body adapted to hide the backside of the semiconductor wafer during a process in the reaction tube and including a wafer lifter having a portion that can be disengaged from and coupled to the holder body so that a lower portion of the semiconductor wafer is supported by the dual boat and so that the semiconductor wafer can be lifted up from the holder body when the semiconductor wafer is loaded or unloaded; and a separation boundary arranged between the holder body and the wafer lifter and including a gas inflow interception surface adapted to hinder reaction gas from flowing through the separation boundary;

wherein the wafer lifter includes support poles adapted to support at least three points of the semiconductor wafer in a side guard of the holder body;

wherein the holder body includes through holes adapted to inset the support poles into and remove the support poles therefrom; and wherein at least one of the support poles has a lifting rod arranged at a lower portion thereof, the lifting rod being adapted to be operated by the second wafer loading boat of the dual boat;

wherein the lifting rod has an insertion groove arranged at a lower portion thereof such that an end portion of the wafer support of a second wafer loading boat is adapted to be inserted into and coupled to the insertion groove.

5. The semiconductor manufacturing system of claim 4, wherein the gas inflow interception surface comprises tapered surfaces facing each other.

6. The semiconductor manufacturing system of claim 4, wherein the gas inflow interception surface comprises bent and stepped surfaces that are continually bent.

7. A wafer holder for a semiconductor manufacturing system that comprises a reaction tube and a dual boat, the reaction tube providing a semiconductor wafer with a sealed space to perform a process, the dual boat being arranged in the process space provided by the reaction tube and loading at least one semiconductor wafer, the dual boat including first and second wafer loading boats, the first and second wafer loading boats spaced from each other and moving up and down with respect to each other, the wafer holder being mounted on the dual boat, the semiconductor wafer being arranged on the wafer holder, a backside of the semiconductor wafer being hidden during a process, the wafer holder comprising:

a holder body adapted to hide the backside of the semiconductor wafer during a process in the reaction tube and including a wafer lifter having a portion that can be disengaged from and coupled to the holder body so that a lower portion of the semiconductor wafer is supported by the dual boat and so that the semiconductor wafer can be lifted up from the holder body when the semiconductor wafer is loaded or unloaded; and a separation boundary arranged between the holder body and the wafer lifter and including a gas inflow interception surface adapted to hinder reaction gas from flowing through the separation boundary;

wherein wafer lifter comprises:

an upper holder body portion operated by the second wafer loading boat and adapted to lift up at least the semiconductor wafer; and a lower holder body portion arranged on the first wafer loading boat;

wherein the upper holder body portion has a cutaway portion adapted to provide an insertion area to a robot arm for loading and unloading the semiconductor wafer; and wherein the lower holder body includes a projecting latch engaged with the cutaway portion and an opening formed at an edge thereof, the opening adapted to allow the second wafer loading boat to lift up the upper holder body.

8. The wafer holder of claim 7, wherein the gas inflow interception surface comprises tapered surfaces facing each other.

9. The wafer holder of claim 7, wherein the gas inflow interception surface comprises bent and stepped surfaces that are continually bent.

10. A semiconductor manufacturing system comprising:

a reaction tube and a dual boat, the reaction tube providing a semiconductor wafer with a sealed space to perform a process, the dual boat being arranged in the process space provided by the reaction tube and loading at least one semiconductor wafer, the dual boat including first and second wafer loading boats, the first and second wafer loading boats spaced from each other and moving up and down with respect to each other;

a wafer holder mounted on the dual boat, the semiconductor wafer being arranged on the wafer holder, a backside of the semiconductor wafer being hidden during a process, the wafer holder comprising:

a holder body adapted to hide the backside of the semiconductor wafer during a process in the reaction tube and including a wafer lifter having a portion that can be disengaged from and coupled to the holder body so that a lower portion of the semiconductor wafer is supported by the dual boat and so that the semiconductor wafer can be lifted up from the holder body when the semiconductor wafer is loaded or unloaded; and a separation boundary arranged between the holder body and the wafer lifter and including a gas inflow interception surface adapted to hinder reaction gas from flowing through the separation boundary;

wherein wafer lifter comprises:

an upper holder body portion operated by the second wafer loading boat and adapted to lift up at least the semiconductor wafer; and a lower holder body portion arranged on the first wafer loading boat;

wherein the upper bolder body portion has a cutaway portion adapted to provide an insertion area to a robot arm for loading and unloading the semiconductor wafer; and wherein the lower holder body includes a projecting latch engaged with the cutaway portion and an opening formed at an edge thereof, the opening adapted to allow the second wafer loading boat to lift up the upper holder body.

11. The semiconductor manufacturing system of claim 10, wherein the gas inflow interception surface comprises tapered surfaces facing each other.

12. The semiconductor manufacturing system of claim 10, wherein the gas inflow interception surface comprises bent and stepped surfaces that are continually bent.

* * * * *